US012094740B2

(12) United States Patent
Gajendra et al.

(10) Patent No.: US 12,094,740 B2
(45) Date of Patent: Sep. 17, 2024

(54) AUTOMATED DRY-IN DRY-OUT DUAL SIDE POLISHING OF SILICON SUBSTRATES WITH INTEGRATED SPIN RINSE DRY AND METROLOGY

(71) Applicant: Applied Materials, Inc., Santa Clara, CA (US)

(72) Inventors: Manoj A. Gajendra, Bangalore (IN); Mahadev Joshi, Bangalore (IN); Joseph Antony Jonathan, Kalispell, MT (US); Jamie S. Leighton, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 493 days.

(21) Appl. No.: 17/212,862

(22) Filed: Mar. 25, 2021

(65) Prior Publication Data
US 2022/0310424 A1 Sep. 29, 2022

(51) Int. Cl.
*H01L 21/67* (2006.01)
*B08B 3/02* (2006.01)
(Continued)

(52) U.S. Cl.
CPC ........ *H01L 21/67253* (2013.01); *B08B 3/022* (2013.01); *B08B 5/02* (2013.01); *B08B 13/00* (2013.01); *B24B 37/013* (2013.01); *B24B 37/345* (2013.01); *H01L 21/02057* (2013.01); *H01L 21/30625* (2013.01); *H01L 21/68707* (2013.01); *H01L 22/12* (2013.01)

(58) Field of Classification Search
CPC ......... H01L 21/67253; H01L 21/02057; H01L 21/30625; H01L 21/68707; H01L 22/12; B08B 3/022; B08B 5/02; B08B 113/00; B24B 37/013; B24B 37/345
USPC ......................................................... 438/14
See application file for complete search history.

(56) References Cited

U.S. PATENT DOCUMENTS 6,979,248 B2    12/2005  Hu et al.
2008/0093022 A1  4/2008  Yilmaz et al.
(Continued)

FOREIGN PATENT DOCUMENTS

EP      1016126 A2    7/2000
TW    201935556 A    9/2019
(Continued)

OTHER PUBLICATIONS

International Search Report and Written Opinion for Application PCT/US2022/016616 dated May 24, 2022.
(Continued)

*Primary Examiner* — Jasmine J Clark
(74) *Attorney, Agent, or Firm* — Patterson + Sheridan, LLP

(57) ABSTRACT

A method and apparatus for polishing a substrate is disclosed herein. More specifically, the apparatus relates to an integrated CMP system for polishing substrates. The CMP system has a polishing station configured to polish substrates. A spin rinse dry (SRD) station configured to clean and dry the substrates. A metrology station configured to measure parameters of the substrates. A robot configured to move the substrate in to and out of the SRD station. And an effector rinse and dry (EERD) station configured to clean and dry an end effector of the robot.

20 Claims, 6 Drawing Sheets

(51) Int. Cl.
    *B08B 5/02*     (2006.01)
    *B08B 13/00*     (2006.01)
    *B24B 37/013*     (2012.01)
    *B24B 37/34*     (2012.01)
    *H01L 21/02*     (2006.01)
    *H01L 21/306*     (2006.01)
    *H01L 21/66*     (2006.01)
    *H01L 21/687*     (2006.01)

(56) References Cited

U.S. PATENT DOCUMENTS

| | | |
|---|---|---|
| 2012/0255795 A1 | 10/2012 | Fenske et al. |
| 2013/0185884 A1* | 7/2013 | Ko .................... H01L 21/67046 15/209.1 |
| 2015/0001087 A1 | 1/2015 | Dinneen et al. |
| 2019/0076986 A1 | 3/2019 | Shigematsu |
| 2021/0272798 A1* | 9/2021 | Chen ................. H01L 21/67219 |

FOREIGN PATENT DOCUMENTS

| | | |
|---|---|---|
| WO | 9913498 A2 | 3/1999 |
| WO | 2001016290 A2 | 3/2001 |

OTHER PUBLICATIONS

Taiwan Office Action for Application No. 111110114 dated Jun. 26, 2024.

* cited by examiner

AUTOMATED DRY-IN DRY-OUT DUAL SIDE POLISHING OF SILICON SUBSTRATES WITH INTEGRATED SPIN RINSE DRY AND METROLOGY

BACKGROUND

Field

Embodiments of the present disclosure generally relate to methods and apparatuses used in semiconductor device manufacturing. In particular, embodiments herein relate to a method and apparatus for verifying material removal from a substrate in a polishing system.

Description of the Related Art

Chemical mechanical polishing (CMP) is commonly used in the manufacturing of high-density integrated circuits to planarize or polish a layer of material deposited on a substrate. A CMP system typically includes a first portion, e.g., a substrate polishing portion featuring one or more polishing stations, and a second portion featuring one of post-CMP cleaning such as a spin rinse dry (SRD) station and pre or post-CMP metrology stations. The second portion is often integrated with the first portion to form a single polishing system. The second portion typically includes substrate handlers used to transfer substrates between the first and second portions and between individual systems or stations within the second portion.

During a polishing process, substrates may be disposed in a horizontal or vertical orientation to urge a device side surface against a polishing pad in the presence of a polishing fluid, such may be a slurry. Substrates are first polished and then moved to be cleaned in a cleaner.

The use of silicon carbide (SiC) substrates are the future in power electronics and electric vehicles (EV). SiC substrates require special modified processes because of their unique material properties, such as hardness and transparency. The SiC substrate goes through a polishing cycle on a chemical mechanical polishing (CMP) tool to remove material and planarize the substrate. The material removal on the substrate is performed by the CMP tool according to a recipe. Since the SiC material of the substrate is very hard, the polishing process involves a high oxidizer based slurry to support material removal. However, the SiC removal process is still very slow. Additionally, SiC substrate is also transparent, thus making constant verification of the material removal for comparison with the recipe very challenging and difficult to obtain a desired material thickness.

Accordingly, there is a need in the art for substrate processing systems that facilitate the material removal from SiC substrates.

SUMMARY

A method and apparatus for polishing a substrate is disclosed herein. More specifically, the apparatus relates to an integrated CMP system for polishing substrates. The CMP system has a polishing station configured to polish substrates. A spin rinse dry (SRD) station configured to clean and dry the substrates. A metrology station configured to measure parameters of the substrates. A robot configured to move the substrate in to and out of the SRD station. An effector rinse and dry (EERD) station configured to clean and dry an end effector of the robot and a wet tank configured to the substrates wet while in que to cleaning or polishing In another embodiment, a method for polishing a substrate is provided. The method begins by moving the substrate to a head clean load unload station in a polishing unit. The substrate is then polished in the polishing unit. The polished substrate is moved with an end effector of a robot to a spin rinse dry (SRD) station to clean the substrate. While the substrate is being cleaned by the SRD station, cleaning the end effector of the robot in an end effector rinse dry (EERD) station. The substrate cleaned by the SRD station is then moved with the clean end effector of the robot to a meteorology station.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, which may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
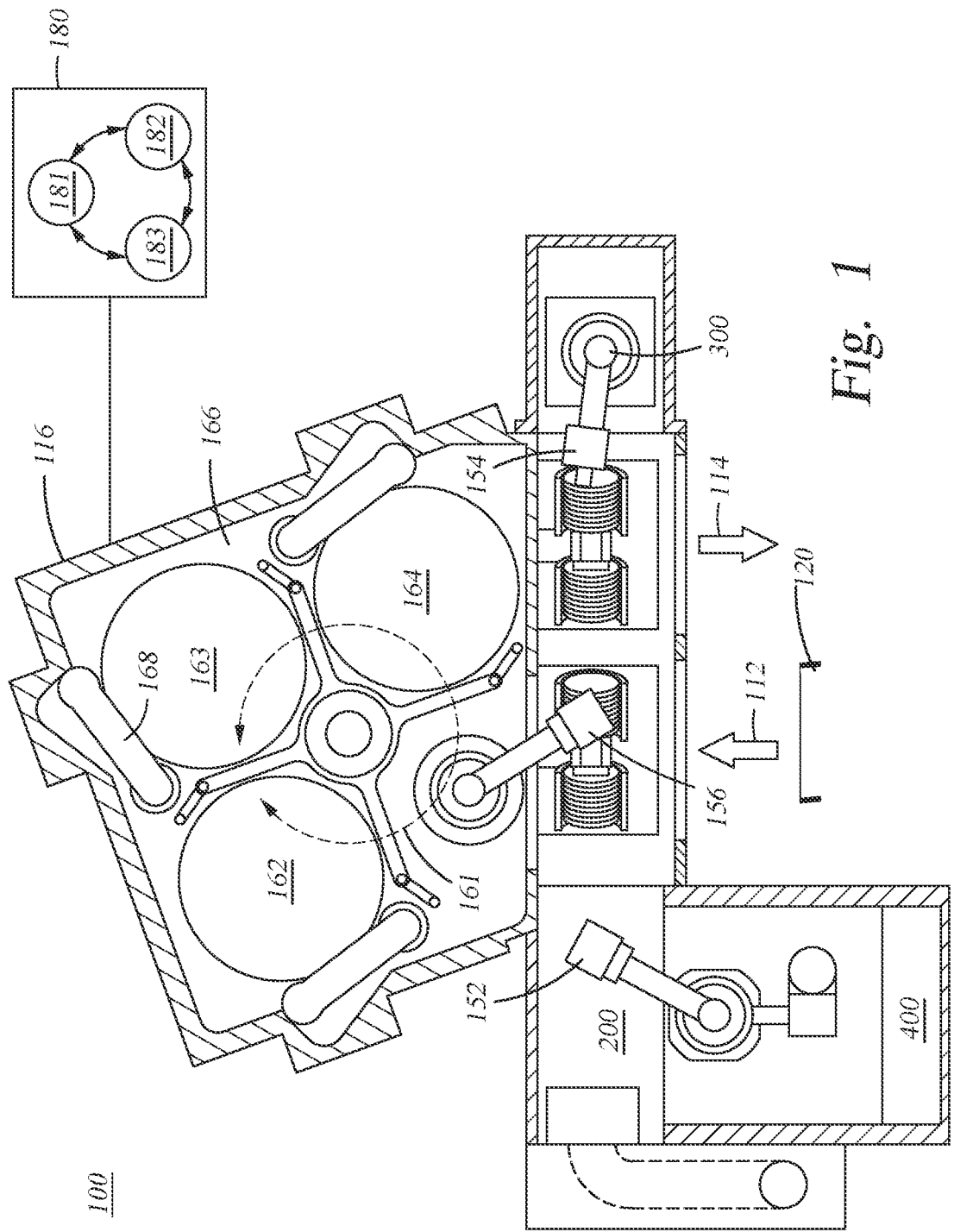
FIG. 1 is a schematic plan view of an exemplary chemical mechanical polishing (CMP) processing system.

In embodiments described herein, a chemical mechanical polishing (CMP) processing system is provided. The CMP system is used in the manufacturing of high-density integrated circuits to planarize or polish a layer of material deposited on a substrate. The CMP system enables "Dry-in/Dry-Out" dual side polishing of silicon carbide (SiC) or other substrates. The CMP system has a polisher, a wet cassette tank, a dry cassette tank, an integrated spin rinse dry (SRD) station, end effector rinse and dry station (EERD), and a metrology station having optical character recognition. The metrology station includes a real time metrology and substrate identification through an optical character recognition (OCR) station. The CMP system is highly automated for efficient and high-throughput substrate polishing.

In one example, incoming SiC substrates are placed in an input cassette, which is then submerged in a water bath to rinse the substrates and remove loose contamination from the surface of the substrates. The rinsed substrates are sent to the SRD and then to the metrology station for a pre-check of the metrological parameters or fed to the polishing station without a pre-check (depending on the baseline accuracy of material removal required).

After the grinding of a SiC substrate, the substrate is polished using a duel side polishing process on the CMP system. Since the SiC material is very hard, strong oxidizer based slurry is used to remove material from the substrate. Even with the use of strong oxidizer, material removal from the SiC substrate can be a very slow process. Since the SiC substrate is transparent, a novel automated technique described herein is utilized to constantly verify amount of material removal to compared with target removal amounts as expected utilizing a particular CMP recipe. The CMP system cleans the substrate to remove slurry particles and checks the weight of the substrate with high accuracy with metrology equipment of the metrology station. The metrology equipment also has a camera, which accurately measures the surface area of the substrate. With the measured surface area, the CMP system can determine the material removal accurately and automatically.

The CMP system has a robot with an end effector configured to transport the substrate throughout the CMP system. The EERD station is integrated on the CMP system to clean the robot end effector (blade) enabling the end effector to transfer the wet (and contaminated) and dry (and cleaned) substrates. Cleaning of the end effector allows the substrates to be transferred to and from the SRD station seamlessly without the need for two separate robots to avoid cross contamination.

The SRD station performs a wet clean and then dries the substrate of residual slurry deposits. The SRD station is designed to handle most kinds of substrates. After the substrate is cleaned in the SRD station, the substrate is moved by the now cleaned robot end effector to the metrology station for the measurement of weight and surface area by a track robot.

The measured amount of material removed after polishing along with substrate ID is stored automatically by substrate identification (ID). The substrate ID and substrate metrology information can be read on the fly without any manual intervention. The substrate is loaded/unloaded by a robot to/from the substrate ID reader station that reads the substrate ID. A camera within the substrate ID reader station scans the substrate surface for substrate ID without a need of a flat/notch orienter to keep flat/notch in any particular orientation to enable the substrate ID to be read.

The metrology unit has a vision system with lighting for substrate ID reading. The metrology unit is integrated with the polishing system to measure the weight, surface area and read the substrate ID. By comparing initial and final thicknesses of the substrate, the amount of material removed from the substrate can be accurately measured. In one example, the thickness (as the substrates has considerable tolerances between them) can be determined using the formula thickness=mass/(surface area×density). Density is generally considered a constant for the substrate. The density can be previously measure, calculated or know or determined through other techniques, and can be obtained from memory of the CMP system or other source. The mass is measured accurately by a high precision scale, while the surface area is computed by the image processing, i.e., camera. Thus, using the density, surface area and weight before and after polishing, the change in thickness can be calculated, from which the amount of material removed from the substrate can be accurately determined.

As camera can detect the substrate ID, information, such as the metrology results (including micro cracks on the substrate), thickness and material loss determinations, can be electrically associated (i.e., stored in memory) with a specific substrate through that substrate's detect substrate ID. The information can be utilized, along with information associated with other substrates, for further evaluation and recipe tuning. To improve the function and accuracy of the camera, a lighting unit is positioned uniquely below the substrate while the camera is mounted above the substrate. The relative position of the lighting unit to the camera provide backlighting of the substrate that improves the contrast and reading of the substrate ID. The spacing between lighting to substrate to camera can be selected and calibrated to improve accurate reading of the substrate ID.

Thus, CMP system can perform all the functions mentioned above in a highly automated way without manual intervention. This CMP system is also able to handle most types of substrates (with flat features/notch features/different sizes). The camera is set up in such a manner such that it can scan the entire substrate in one direction and detect the parameters in less than a second. The substrate ID and substrate metrology specification can be read on the fly (i.e., while in the metrology station) without any manual intervention.

This CMP system will now be discussed with respect to FIG. 1. FIG. 1 is a schematic plan view of an exemplary chemical mechanical polishing (CMP) processing system 100. The CMP system 100 includes a plurality of integrated stations for processing a substrate 120. The CMP system 100 includes a polishing station 116, a wet tank cassette station 112, a dry tank cassette station 114, a spin rinse dry (SRD) station 400, a metrology station 300, an effector rinse and a dry (EERD) station 200, and a plurality of robots 152, 154, 156 for moving a substrate about the CMP system 100.

The wet tank cassette station 112 is configured to accept one or more cassettes of substrates 120 from outside the CMP system 100. The wet tank cassette station 112 has clean water or other fluid in which the substrates 120 are at least partially submerged prior to polishing. The wet tank cassette station 112 has a fluid input and output, i.e., drain. The wet tank cassette station 112 may optionally have a wash-down system in which water is sprayed or poured over the substrates and drained from the wet tank cassette station 112. In this manner, the substrates 120 in the wet tank cassette station 112 remain wet and substantially prevents contamination or other particles from drying to the substrate 120 and adhering to the substrate 120.

The first robot 152 of the plurality of robots moves the substrates 120 between the wet tank cassette station 112, the SRD station 400, and the polishing station 116.

The polishing station 116 has a plurality of polishing stations (162, 163, 164) that are configured to polish the substrate 120. Each polishing station (162, 163, 164) has a polishing pad 166 and a polishing arm 168. Each polishing station (162, 163, 164) additionally has one or more valves for introducing a polishing fluid, such as a slurry or other suitable material, onto the polishing pad 166. The polishing arm 168 has a polishing head configured to hold the substrate 120 during polishing. The polishing head positions the substrate 120 over the polishing pad 166 and urges the substrate 120 against the polishing pad 166 and in contact with the polishing fluid. Material is removed from the substrate 120 in the polishing station 116 according to a recipe, generally stored a computer readable instructions. The substrate 120 may have a hard material layer that requires polishing or removal using the CMP recipe, such as SiC material layer. When removing SiC material from the substrate 120 in the polishing station, a high oxidizer based slurry is provided to the polishing pad 166 to support the removal of the hard material. In one example, each polishing station (162, 163, 164) may be configured with a finer grit slurry or different type of polishing pad 166 to sequentially remove the material layer from the substrate 120 according to a recipe.

Figure 4A:
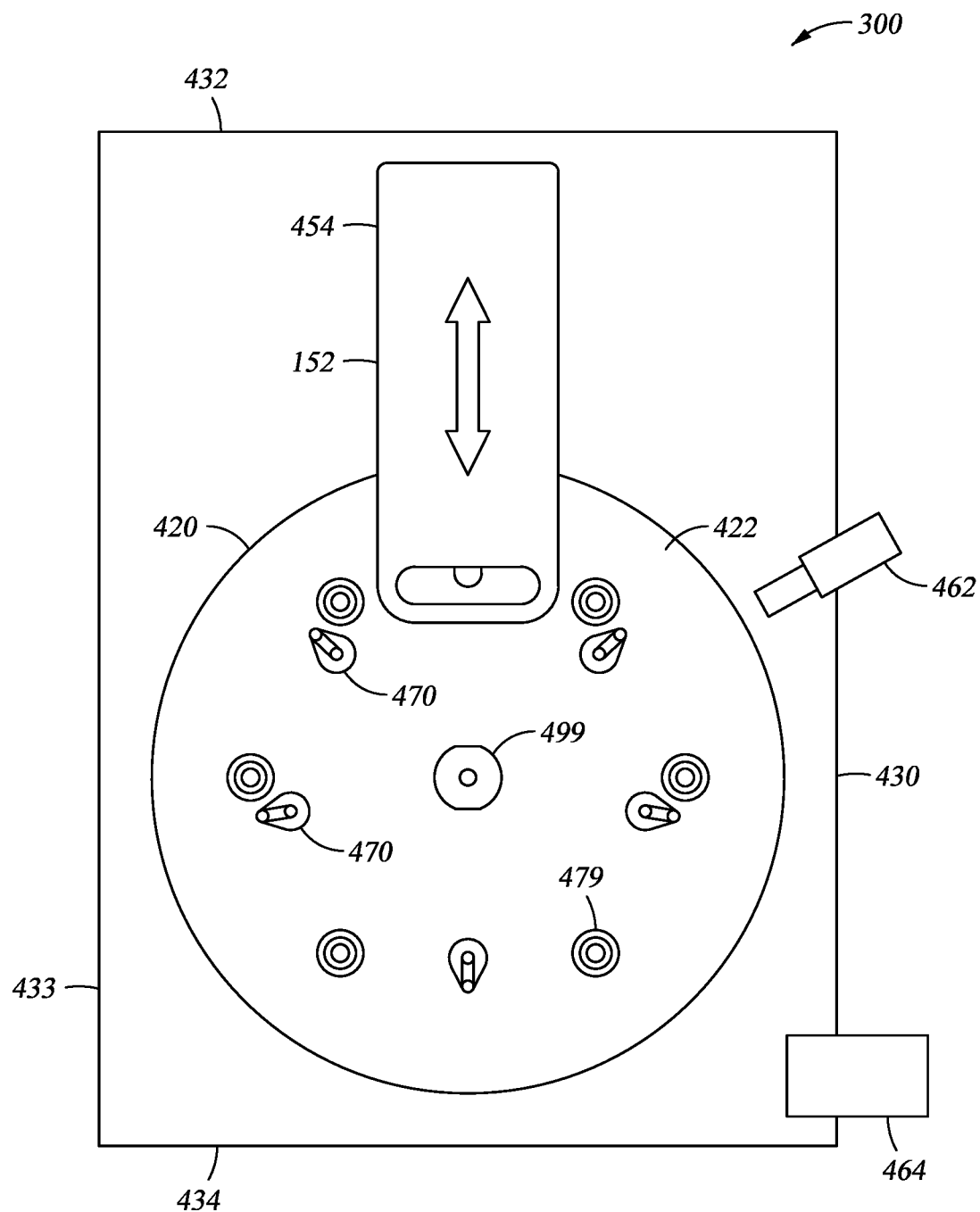
FIG. 4A illustrates a spin rinse dry (SRD) station of the CMP system of FIG. 1.

The first robot 152 moves the substrate 120 to the buffer station for transfer to the SRD station 400. FIG. 4A illustrates the SRD station 400. In semiconductor wet processing applications, such as that utilizing CMP system 100, the substrates 120 are spun to clean and dry the substrate to reduce the potential for damage and contamination. For example, residual slurry is removed in the SRD station 400 that could potentially dry on the surface of the substrate 120 and create defects. Additionally, by removing slurry and fluid from the substrate in the SRD station 400, an accurate weight of the substrate 120 can be determined, which enables accurate determination of the amount of material removed from the substrate.

Figure 4B:
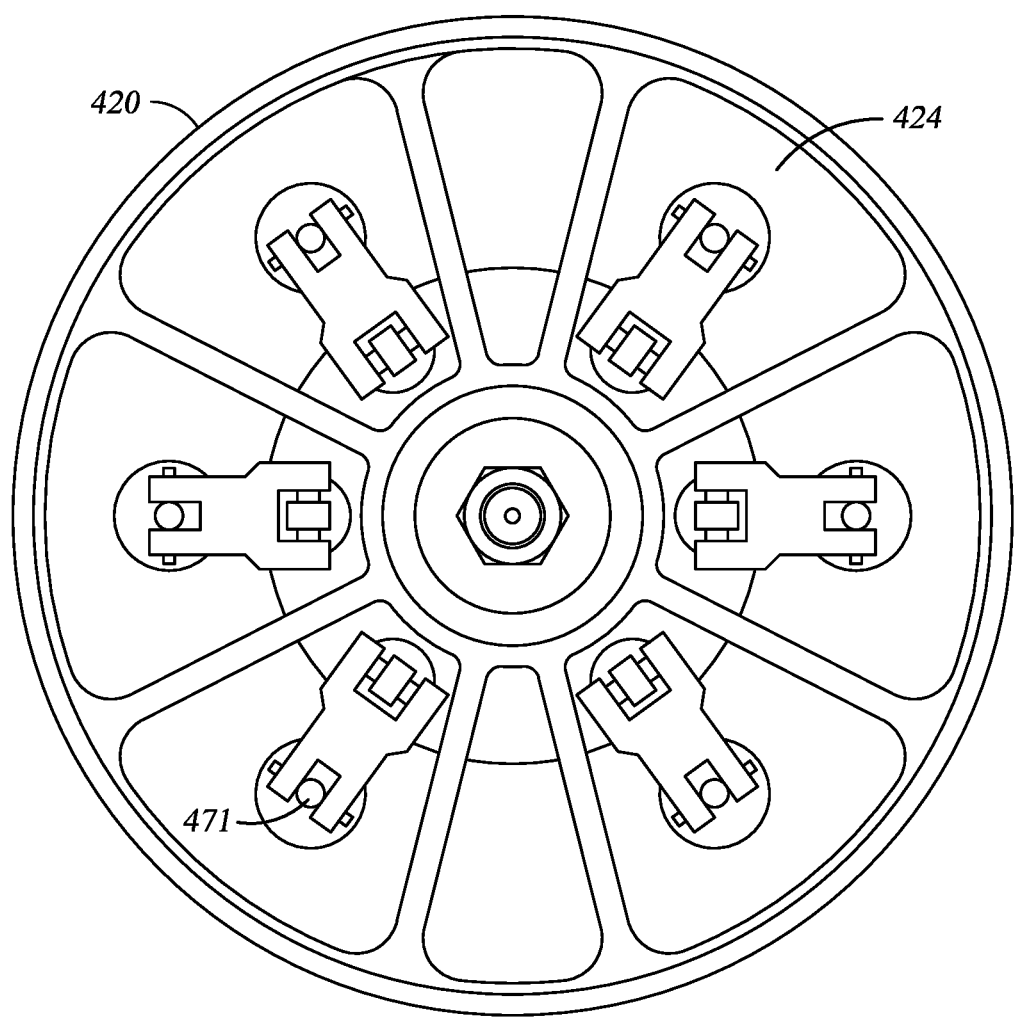
FIG. 4B illustrates a rotary gripper of the spin rinse dry (SRD) station of FIG. 4A.

The SRD station 400 has body 430. The body 430 is a top surface 432, a bottom surface 434 and sides 433. The top surface 432, the bottom surface 434 and the sides 433 enclose an interior processing region 420 of the body 430. A rotary gripper 420 is disposed in the interior processing region 420 of the body 430. FIG. 4B illustrates the rotary gripper 420. The rotary gripper 420 in the SRD station 400 is configured to position the substrates 120 in a vertical orientation. It should be appreciated however, that the rotary gripper 420 may alternately be configured to position the substrates 120 in a horizontal or other orientation.

A fluid sprayer 462 and a drain 464 are disposed through the body 430 and fluidly couples to the interior processing region. The fluid sprayer 462 may be disposed through the sides 433, the bottom surface 434 or the top surface 432 of the body 430. The fluid sprayer 462 is configured to direct a stream of fluid, such as clean water, at the substrate 120 supported by the rotary gripper 420. The drain 464 is disposed through the sides 433 or the bottom surface 424, and drains the fluid provided by the fluid sprayer 462 from the interior processing region 420. The drain 464 may be coupled to a pump or utilize gravity to remove fluid from the interior processing region 420. A slot 454 may be disposed in the top surface 432 or the sides 433. The slot 454 is sized to allow the substrate 120 disposed on an end effector of the robot 152 to be moved into and out of the interior processing region 420. In one embodiment the slot 454 is disposed in the top surface 432 and is sized to permit the substrate 120 be transferred between the rotary gripper 420 and the end effector of the robot 152.

The rotary gripper 420 has a holding surface 422 and a backside surface 424. The holding surface 422 has multiple fingers 470. The backside surface 424 has a plurality of actuators 471. Each actuator 471 is coupled to and is configured to move a respective one of the fingers 470. When actuated to a first position, the fingers 470 secure the substrate 120 to the holding surface 422 of the rotary gripper 420. When actuated to a second position, the fingers 470 release the substrate 120 from the holding surface 422 of the rotary gripper 420.

As stated above, the substrate 120 is gripped by the multiple fingers 470 prior to being spun by the rotary gripper 420. The grip of the substrate 120 by the fingers 470 is adequate to retain the substrate 120 to the rotary gripper 420 while the rotary gripper 420 spins the substrate. In one example, the fingers 470 of the rotary gripper 420 apply about 1 lbf to about 3 lbf to the substrate 120. In normal operation, the fingers 470 are pushed open by the actuators 471. The fingers 470 may be spring loaded to hold the fingers 470 in a closed position that secures the substrate to the holding surface. The substrate 120 is then placed by the end-effector of the first robot 152 between multiple standoffs 479 extending from the holding surface 422 that serve as a platform for placing the substrate 120. The radial movement of the placed substrate 120 is restricted by the standoffs 479 along a periphery of the substrate 120. The standoffs 479 also causes the substrate 120 to be centered and aligned on the rotary gripper 420 where the fingers 470 close onto and hold the substrate 120. When the mechanical actuation by the actuators 471 holding the fingers 470 open is removed, the springs displace the fingers 470 to a closed position that urges the substrate 120 against the circumscribing fingers 470, thus centering and aligning the substrate on the holding surface. The rotary gripper 420 design centers and holds whatever alignment the substrate 120 is brought in at. In another embodiments, the rotary gripper 420 aligns the substrate 120 to a predetermined position, for example, in a cut up position.

The rotary gripper 420 is connected to a motor that spins the rotary gripper 420 and the substrate 120 mounted thereto during processing. When processing a flatted (or notched) substrates, a pre-aligning station is used to rotate the substrate 120 to a predefined orientation that prevents the substrate flat, cutout or notch from being positioned in a location in which the finger 470 cannot grip the substrate 120. Multiple fingers 470 are symmetrically located on the holding surface 422, while the multiple standoffs 479 are asymmetric placed on the holding surface 422. The spacing of the standoffs 479 are selected to allow access to by the end-effector of the robot. In one example, the fingers 470 are positioned such that the distance between any two adjacent fingers is greater than the maximum chord dimension of substrate flat. This ensures that, in the worst cases, the substrate flat can only be near one finger 470 and the substrate 120 can still gripped by all the remaining other fingers 470. The finger 470 are removable to help with maintenance.

The asymmetric standoffs 479 and the missing substrate mass at the substrate flat can induce an imbalance (static and dynamic) in spinning the rotary gripper 420. To compensate for this imbalance, an asymmetric hole 499 is formed in the rotary gripper 420 or rotor attachment to provide rotor balance and minimize wobble of the gripper 420 while spinning the substrate 120. The asymmetric standoffs 479 and symmetric fingers 470 can accommodate different edge conditions (beveled, jagged, etc.) in the substrate 120 while keeping the substrate 120 from moving out of a position centered on the rotary gripper 420 by less than 1.5 mm, i.e., aligning the substrate 120 on the rotary gripper 420. The rotary gripper 420 can handle a variety of substrate thicknesses (for example, 300 um to 825 um) as well as temperatures up to about 200° C.

In one example, the rotary gripper 420 holds and rotates the substrate 120 while the fluid sprayer 462 sprays clean water at the substrate 120 to thoroughly remove slurry and other particles from the entire surface of the substrate 120. The drain 464 removes the fluid containing the particles from the interior processing region 420 of the SRD station 400 to prevent the reintroduction or contamination of particles from the fluid present in the interior processing region 420 back to the surface of the substrate 120. The fluid sprayer 462 is turned off and the substrate 120 is allowed to rotate on the rotary gripper 420 to remove and dry the substrate 120 of any remaining fluid by centrifugal force.

The SRD station 400 has now clean and dried the substrate and the substrate is ready for subsequent processing operations.

Figure 2:
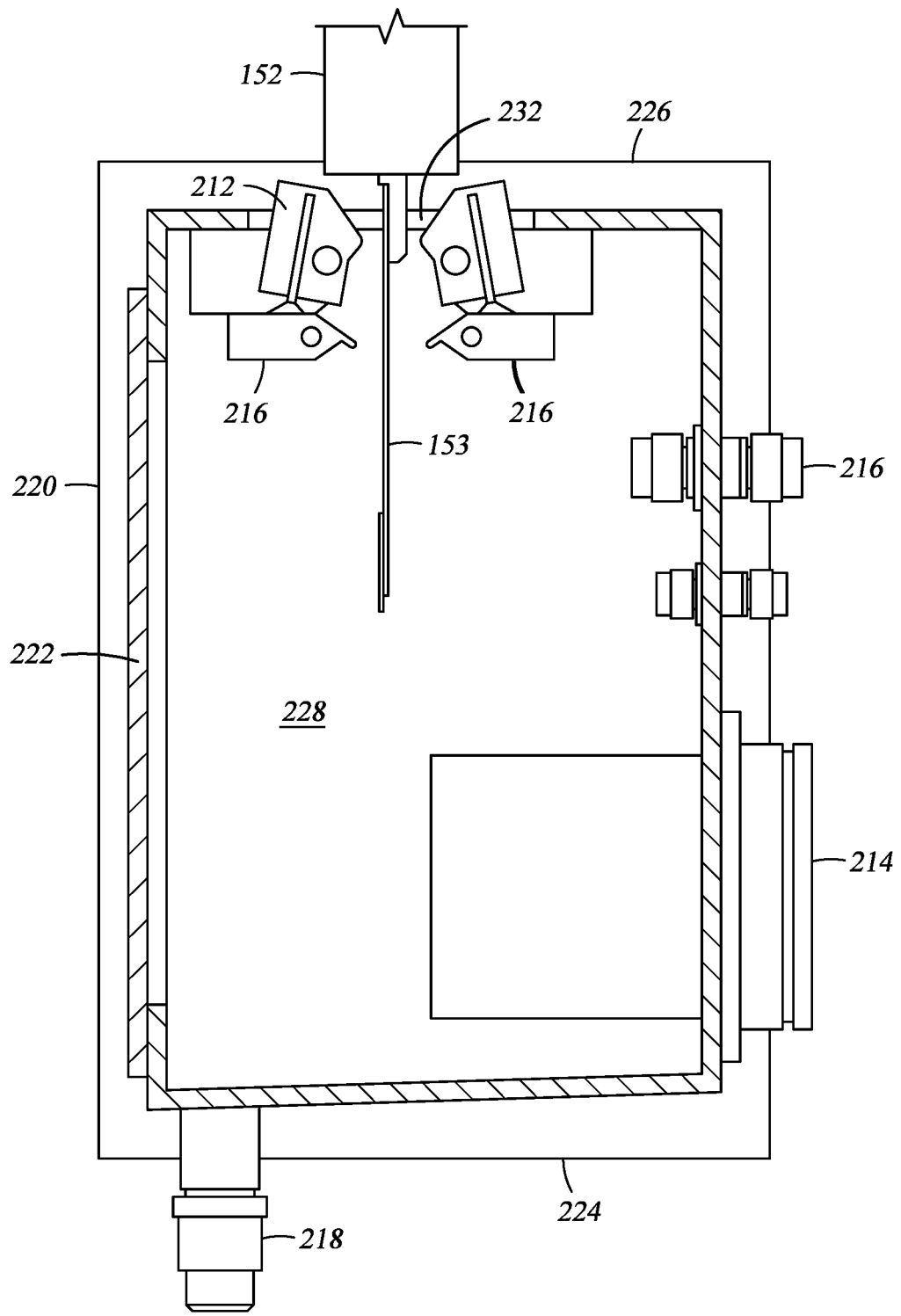
FIG. 2 illustrates an end effector rinse and dry (EERD) station of the CMP system of FIG. 1.

As discussed above, substrates are transferred between the stations of the CMP system by robots. The robot blade, i.e., the end effector which holds the substrate 120 during transfer, handles both pre-processed substrates and post-processed substrates, except in embodiments having multiple robots or multiple robot blades on a single robot. While the SRD station 400 is cleaning the substrate 120 and the robot blade is free from substrates, the substrate-less robot blade is cleaned in the EERD to prevent the introduction of contamination, such as slurry particles, onto the now clean substrate exiting the SRD station 400. FIG. 2 illustrates the EERD station 200 for the CMP system of FIG. 1.

The EERD station 200 has a body 220. The body 220 has a top 226, a bottom 224, and sidewalls 222. The top 226, the bottom 224 and the sidewalls 222 enclose an interior volume 228 of the body 220. An opening 232 may be formed in the top 226. Alternately, the opening 232 may be formed in one of the sidewalls 222. The opening 232 is sized to allow an end effector 153 of the first robot 152 to access and enter the interior volume 228 of the EERD station 200.

The EERD station 200 has multiple rinse nozzles 216 and air knives 212. The rinse nozzles 216 dispense de-ionized water (DIW) or other suitable fluid chemistries to effectively rinse the end effector 153 of the first robot 152. A drain 218 is formed in the bottom 224 of the body 220. The bottom 224 may be angled towards the drain 218. In one example, the drain 218 is disposed adjacent to one of the sidewalls 222 to promote drainage of the DIW toward the drain 218. Alternately, the drain 218 may be formed anywhere in the bottom 224 with the bottom 224 angled toward the drain 218. For example, the drain 218 may be formed in a center of the bottom 224 and the bottom may be bowl shaped with the drain 218 at the bottom of the bowl.

The air knives 212 are positioned adjacent to the opening 232. The air knives 212 flow clean dry air (CDA) or other suitable gas (such as $N_2$, etc.) to dry the rinsed end effector 153 passing through the opening 232. For example, the air knives 212 remove the fluid from the end effector 153 as the end effector 153 is removed from the interior volume 228 of the EERD station 200.

A vent 214 may be formed in the sidewalls 222 of the body 220. The vent 214 is elevated above the drain 218. The vent 214 is spaced above the bottom 224 and the drain 218 to substantially prevent fluid intended to be removed from the interior volume 228 of the body 220 through the drain 218 from entering the vent 214. CDA or other suitable gases entering into the interior volume 228 through the air knives 212 is removed from the interior volume 228 by the vent 214. In one or more examples, the body 220 may have more than one vent 214 to effectively remove gases from the interior volume from the air knives 212. The vent 214 may be connected to a factory exhaust either directly or through a pump.

During operation, the end effector 153 of the robot is pre-positioned outside the EERD station 200 when the rinse turns on. The end effector 153 extends into the interior volume 228 through the opening 332. The end effector 153 is rinsed by the multiple rinse nozzles 216 as it enters through the opening 232. After the end effector 153 is sufficiently rinsed, the rinse nozzles 216 are turned off and the air knives 212 are turn on. Then end effector 153 retracts out of the interior volume 228 through the opening 332 and is dried on both sides as it retracts out. The end effector 153 of the robot is now dry and substantially free from contamination, and ready to pick up a clean dry substrate 120.

The EERD station 200 is where the end effector 153 of the first robot 152 is rinsed and dried, and made ready to pick up a dried clean substrate 120. The wet end effector 153 handles the substrate whenever the substrate 120 is wet. When the end effector 153 needs to handle a dry clean substrate 120, the end effector 153 is rinsed and dried prior to handling the clean dry substrate 120. Thus, only one robot, such as the first robot 152, is needed to handle the movement of both cleaned and uncleaned substrates 120 into and out of the SRD station 400 without contaminating cleaned substrates.

The first robot 152 moves the substrate 120 to the metrology station 300 for measurement to determine the amount of material removed from the substrate 120. From the amount of material removed from the substrate 120, need for additional processing of the substrate 120 can be determined.

Figure 3:
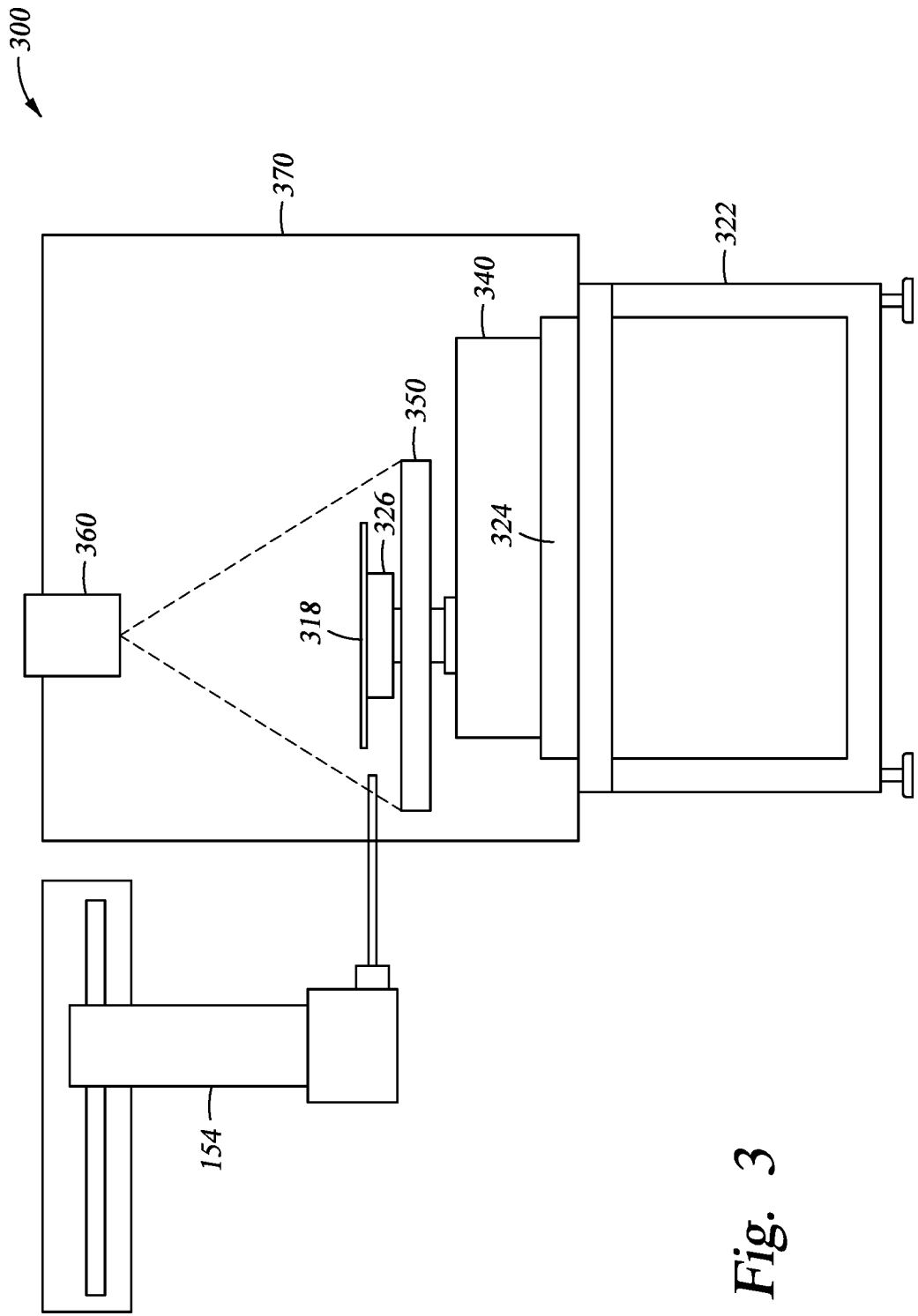
FIG. 3 illustrates a metrology station of the CMP system of FIG. 1.

The metrology station 300 is used to measure the thickness of a material layer disposed on the substrate 120 before and/or after polishing, to inspect the substrate 120 after polishing to determine if a material layer has been cleared from the surface of the substrate, and/or to inspect the substrate surface for defects before and/or after polishing. In some examples, the substrate 120 may be returned to the polishing pads 166 for further polishing and/or directed to a different substrate processing station or station, such as a dry tank cassette station 114 based on the measurement or surface inspection results obtained using the metrology station 300. FIG. 3 illustrates the metrology station 300 for the CMP system 100 of FIG. 1.

The metrology station 300 has a substrate holder 326, a support frame 322, a scale 340 for weighing the substrate, and a camera 360. The scale 340 is disposed on a vibration isolator 324. The vibration isolator 324 is coupled to the support frame 322. The vibration isolator 324 include energy transmission damping materials such as plastics and elastomers that reduce the amount of energy transmitted through the isolator 324. Thus, the vibration isolator 324 dampens outside environmental interference such as vibrations from traveling between the support frame 322 and the scale 340 through the vibration isolator 324 that may affect the performance and accuracy of the scale 340. In one example, the scale 340 has an accuracy suitable to measure the weight of the substrate 120 to within about plus or minus 0.0001 grams.

The camera 360 is operable to scan the surface of the substrate 120. One or more images obtained by the camera 360 are used to measure the surface area of the substrate 120 and detect the substrate ID of the substrate 120. The metrology station 300 is configured to handle an image from the camera 360 that is regular or mirrored. The metrology station 300 includes a lighting system 350 and a shield 370. The shield 370 is disposed about the camera 360, the support frame 322 and the lighting system 350. The lighting system 350 is disposed between the scale 340 and the substrate 120. The lighting system 350 is configured to illuminate the substrate 120 to enable the camera 360 to more readily and accurately measure the substrate parameters, such as surface area and the substrate ID. Illation of the substrate 120 by the lighting system 350 aids improving the accuracy of the surface scan of the substrate 120. The shield 370 prevents ambient light from interfering with the camera 360. To reduce interference of the substrate holder 326 with the lighting system 350, the substrate holder 326 has a small number of fingers, for example three fingers, for receiving the substrate 120 transferred by the robot. The wide spacing of the fingers of the substrate holder 326 permits the lighting system 350 below the substrate to provide better contrast for detecting the substrate ID with the camera 360 mounted above the substrate 120.

Information obtained by the scale 340 and the camera 360 are utilized to determine the amount of material removed from the substrate 120 as described above. With the surface area and change in weight (i.e., the change between pre-polishing and post-polishing weight) of the substrate 120 known, an accurate determination of an amount of material removed by the polishing process can be determined. Using the formula (initial thickness−final thickness) the material loss can be accurately determined. To obtain the thickness (as the substrates has considerable tolerances between each substrate), the formula thickness=mass/(surface area×density) can be used. Density is property the substrate 120. The mass is measured accurately by the scale 340. The surface area is measured by the camera 360. Thus, using the above technique, the amount of material removed from the substrate 120 can be very accurately determined and utilized for end point detection, process monitoring or other use.

Figure 5:
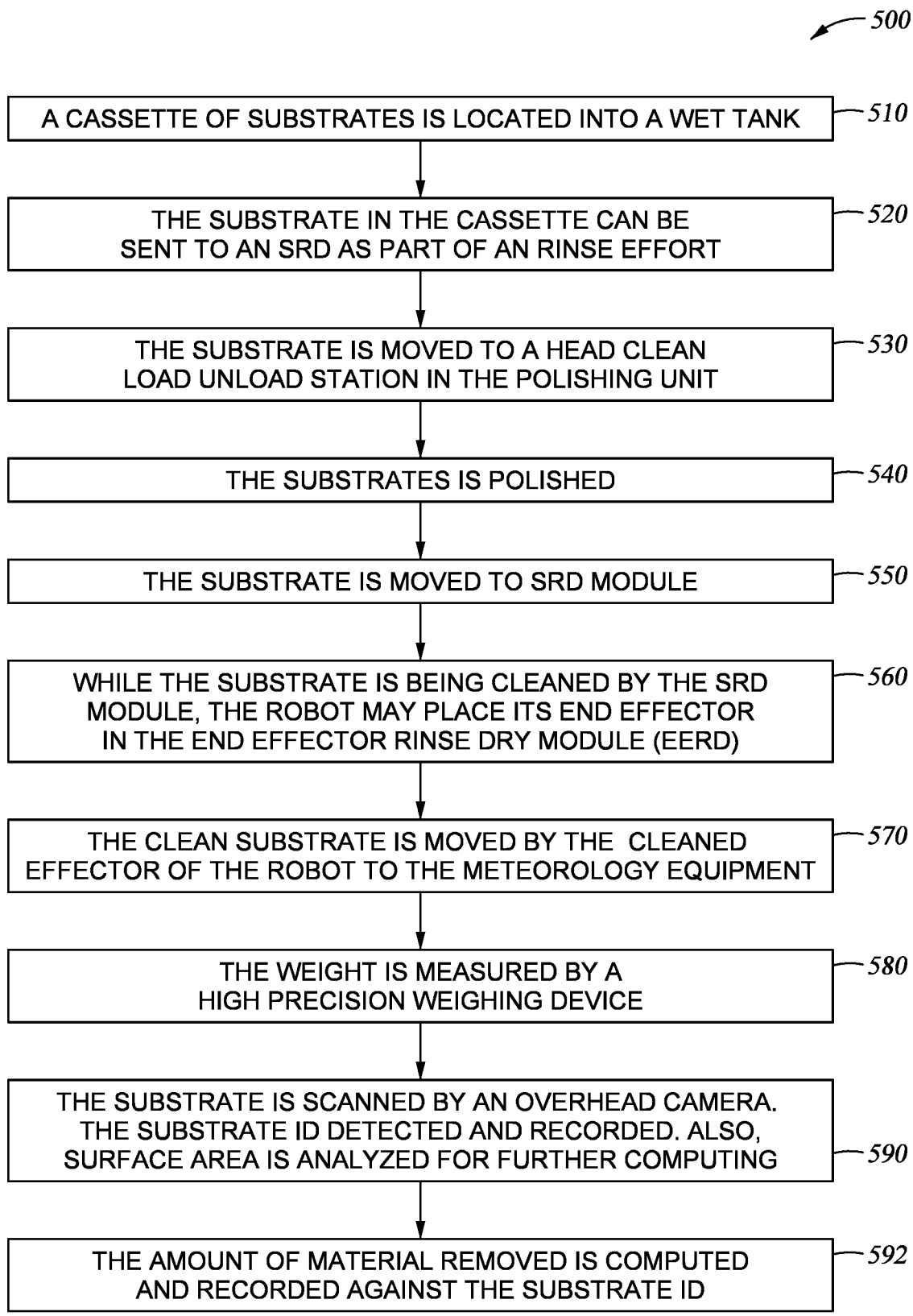
FIG. 5 is a flow diagram of a method for polishing a substrate in the CMP system of FIG. 1.

FIG. 5 is a flow diagram for a method for polishing a substrate in the CMP system of FIG. 1. At block 510, a cassette of pre-polished substrates is loaded into a wet tank cassette station. The cassette may contain 10 or more substrates, for example 50 substrates. The substrates within the cassette are placed in a fluid bath within the wet tank cassette station 112. The substrates contained in the cassette may have undergone a previous processing operation such as a deposition operation, an etch operation, or other operation, which now leaves the substrate in a condition where polishing or planarization of the substrate is desired. Each substrate has a unique substrate ID that identifies the substrate.

At block 520, the substrates in the cassettes are transferred to an SRD station for cleaning. In the SRD station, the substrate is rinsed and dried to remove extraneous or loose material from the substrate prior to polishing. The substrate is dried to prevent the rinse fluid from interfering with future operations. The substrates may optionally be moved to the metrology station for a pre-check of the physical parameters of the substrate for determining a baseline for later calculation of the amount of material removed from the substrate. For example, an initial thickness of the substrate may be determined by the metrology station prior to polishing. Alternately, the substrates parameters may be known which allows the substrates to be directly fed to the polisher without the pre-check for baseline information. The physical parameters for the substrate are stored and associated with the corresponding substrate ID as discussed below in block 592. For example, an initial thickness and a desired final thickness of the substrate may be stored in a database for each unique substrate ID accessible by the CMP system.

At block 530, the substrate is moved to a head clean load unload station in the polishing unit. The substrate may be moved by a robot associated with the head clean load unload station. In the head clean load unload station, the substrate is loaded into a polishing head which retains the substrate during polishing operations within the polishing unit.

At block 540, the substrate is polished in the polishing unit while retained in the polishing head. The substrates may require a dual side polishing process. In one embodiment, the substrate is polished vertically such that both sides of the substrate are polished at the same time. In another embodiment the substrate is polished horizontally against a polishing pad on a first side and then flipped to polish a second side of the substrate. The substrate may have a hard material on the first side and the second side such as SiC. A stronger oxidizer based slurry may be used in the polishing process to remove the hard material. After polishing, the substrate may be moved back to the wet tank, a buffer location or directly to the spin rinse dry station.

At block 550, the substrate is moved to the SRD station. The SRD station cleans the substrate with water or other suitable solutions to remove residual slurry from the surface of the substrate. The SRD then dries the substrate. The SRD station is configured to handle most kinds of substrate.

At block 560, while the substrate is being cleaned by the SRD station, the end effector of the robot is placed in the EERD station. The end effector of the robot utilized to transfer the substrate to the SRD station is cleaned in the EERD station. After cleaning of the end effector in the EERD station, the end effector is free to retrieve the now cleaned substrate from the SRD station without reintroducing contamination to the substrate. For example CMP applications, an un-polished substrate is brought in and set in a pre-process tank. The robot blade picks this substrate and transfers the substrate to the polishing unit for polishing of the substrate. After polishing, the substrate, often dripping wet with process chemistry, is picked up by the same robot blade and moved to later process stations such as the SRD station. When a robot blade handles only wet substrates, the risk of cross or recontamination of cleaned substrates is minimal. However when there is a requirement to dry the processed substrates after the polishing step, using the same robot blade to transfer both wet and dry substrates introduces an unacceptably high risk of contamination of the dry substrate. Advantageously, by utilizing the EERD station to clean the end effector between use to transfer wet and dry substrate substantially reduces the risk of reintroducing contaminants to the surface of the cleaned dry substrate. The EERD station beneficially cleans the robot end effector (blade) enabling a single end effector to be used to transfer the both wet (and contaminated) and dry (and cleaned) substrates seamlessly without the need for two separate costly robots or reduction in process throughput.

At block 570, the clean substrate is moved by the now clean end effector of the robot from the SRD station to the meteorology station. The metrology station includes a high accuracy weighing scale and a camera to measure the surface area along with the substrate ID in a single quick pass. The metrology station includes back lighting for improved reading accuracy of the substrate ID.

At block 580, the weight of the substrate is measured at the metrology station. The weight is measured by a high precision measuring device.

At block 590, the substrate ID is read by the camera. Additionally the surface area is measure by the camera. The substrate ID is recorded in a database or other computer enabled system. The substrate ID is used to associate the metrology results with each individual substrate for further evaluation and recipe tuning. A lighting system positioned below the substrate provides better contrast of the substrate ID for the camera mounted above the substrate. The spacing between lighting system and substrate, and between the substrate and camera, is selected to enhance detection the substrate ID. The lighting unit illuminates the underside of the substrate providing better contrast for the camera for making accurate determinations of the substrate surface area. The lighting and camera system enables handling of substrates that are opaque or translucent, such as translucent SiC wafers and regular mirrored opaque wafers The camera may obtain a regular or mirrored image for calculating the surface area and determining the substrate ID.

Using the formula described above (initial thickness–final thickness), the post-polish material loss from the substrate due to polishing can be accurately determined, i.e., post-polish substrate thickness. Using the above technique, the amount of material removed can be checked very quickly and accurately in-situ the CMP system.

At block 592, the amount of material removed from the substrate is recorded in a database and associated with the substrate ID. Additionally, the weight and surface area of the substrate may also be recorded and associated with the substrate ID in the database. As the substrate moves the throughout the CMP system, the operations utilized to polish the substrate may be adjusted in the recipe to achieve a desired layer thickness or amount of material removal from the substrate. For example, upon determining the post-polish thickness of the substrate is less than the target thickness, returning the substrate to the polishing unit and performing a new polishing recipe selected to remove an amount of material need to reach the target thickness. Alternately in another example, upon determining the amount of material removed is such that the substrate thickness is at the desired final thickness, the substrate is moved to the dry cassette.

In examples described herein, the operation of the CMP system 100, including the metrology station 300 and the EERD station 200, is directed by a system controller 160. The system controller 160 includes a programmable central processing unit (CPU) 181 which is operable with a memory 182 (e.g., non-volatile memory) and support circuits 183. The support circuits 183 are conventionally coupled to the CPU 181 and comprise cache, clock circuits, input/output subsystems, power supplies, and the like, and combinations thereof coupled to the various components of the CMP system 100, to facilitate control thereof. The CPU 181 is one of any form of general purpose computer processor used in an industrial setting, such as a programmable logic controller (PLC), for controlling various components and sub-processors of the processing system. The memory 182, coupled to the CPU 181, is non-transitory and is typically one or more of readily available memories such as random access memory (RAM), read only memory (ROM), floppy disk drive, hard disk, or any other form of digital storage, local or remote. The polishing recipe, the substrate ID, metrology results such as surface area, weight, etc., determinations such as thickness, amount of material removed, etc., other physically substrate information, such as density among others, and other information is stored in the memory 182 or is otherwise accessible by the controller 160.

Typically, the memory 182 is in the form of a non-transitory computer-readable storage media containing instructions (e.g., non-volatile memory), which when executed by the CPU 181, facilitates the operation of the CMP system 100. The instructions in the memory 182 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 180 may be used with one or any combination of the various modular polishing systems described herein and/or with the individual polishing stations thereof.

The embodiments disclosed herein reduce the amount of equipment and handling required for polishing SiC substrates. The CMP system can perform all the functions mentioned above in a highly automated way generally without manual intervention. The CMP system is able to handle most types of substrates, such as substrates with flat features, notch features and/or substrates of different sizes. The EERD station is advantageously configured to clean the robot blade to reduce the number of robots needed and contamination transfer to the clean substrates from the SRD station. The metrology station also enables weight, thickness, material removal and other information to be associated via a substrate ID to unique substrate, enabling improved process control, throughput and product yield.

While the foregoing is directed to embodiments of the present disclosure, other and further embodiments of the disclosure may be devised without departing from the basic scope thereof, and the scope thereof is determined by the claims that follow.

What is claimed is:

1. An integrated chemical mechanical polishing (CMP) system for polishing substrates, the CMP system comprising:
   a polishing station configured to polish a substrate;
   a spin rinse dry (SRD) station configured to clean and dry the substrate;
   a metrology station configured to measure parameters of the substrate;
   a robot configured to move the substrate in to and out of the SRD station;
   an effector rinse and dry (EERD) station configured to clean and dry an end effector of the robot; and
   a wet tank configured to maintain the substrates in a wet state while in queue for cleaning or polishing.

2. The integrated CMP system of claim 1 wherein the EERD station further comprises:
   a body having a top, a bottom, and sidewalls defining an interior volume;
   an opening formed in the body, the opening sized to allow the end effector of the robot to access the interior volume of the body.

3. The integrated CMP system of claim 2 wherein the EERD station further comprises:
   rinse nozzles configured to spray a fluid at the end effector when positioned in the interior volume; and an air knife disposed adjacent the opening and configured flow gas against the end effector as the end effector is extracted from the interior volume.

4. The integrated CMP system of claim 3 wherein the EERD station further comprises:
a vent formed in the sidewalls of the body, the vent connected to a factory exhaust through an exhaust pump, the vent configured to remove all gas provided by the air knife from the interior volume; and
a drain disposed in the body and configured to allow the fluid from the rinse nozzles to exit the interior volume, wherein the vent is elevated relative to the drain.

5. The integrated CMP system of claim 1 wherein the metrology station further comprises:
a support frame;
a substrate holder disposed on the support frame and configured to support the substrate;
a camera disposed above the substrate holder; and
a scale for weighing coupled between the support frame and the substrate holder.

6. The integrated CMP system of claim 5 wherein the metrology station further comprises:
a vibration isolator disposed between the support frame and the scale;
a lighting system disposed between the scale and the support frame; and
a shield disposed about the camera, the support frame and the lighting system.

7. The integrated CMP system of claim 5 wherein the camera is configured to measure a surface area and detect a substrate ID of the substrate.

8. The integrated CMP system of claim 5 wherein the substrate is translucent or opaque.

9. The integrated CMP system of claim 5 wherein SRD further comprises:
a rotary gripper configured with a plurality of fingers and standoffs, wherein the fingers and standoffs center and align the substrate on the rotary gripper.

10. The integrated CMP system of claim 5 wherein the substrate holder can handle flatted or notched substrates of various thicknesses.

11. The integrated CMP system of claim 10 wherein the substrate holder can handle substrates of elevated temperatures, up to 200C.

12. A method for polishing a substrate, the method comprising:
moving the substrate to a head clean load unload station in a polishing unit;
polishing the substrate in the polishing unit;
moving the substrate with an end effector of a robot to a spin rinse dry (SRD) station;
cleaning the substrate in the SRD station;
while the substrate is being cleaned by the SRD station, cleaning the end effector of the robot in an end effector rinse dry (EERD) station; and
moving the substrate cleaned by the SRD station with the cleaned end effector to a metrology station.

13. The method of claim 12 further comprising:
weighing the substrate in a metrology station to determine a weight of the substrate; and
determining a surface area of the substrate in the metrology station.

14. The method of claim 13 further comprising:
calculating an amount of material removed from the substrate; and
recording the amount of material removed with an associated substrate ID for the substrate in a database.

15. The method of claim 14, wherein calculating the amount of material removed comprises:
subtracting a post-polish thickness from an initial thickness, wherein the initial thickness is equal to the weight of the substrate prior to polishing divided by a product of the surface area and a density, and wherein the post-polish thickness is the weight after polishing divided by the product of the surface area and the density.

16. The method of claim 13 further comprising:
illuminating a first side of the substrate while obtaining an image of a second side of the substrate, the first side being opposite to the second side.

17. The method of claim 15, wherein upon determining the post-polish thickness of the substrate is more than a target thickness, returning the substrate to the polishing unit and performing a new polishing recipe selected to remove an amount of material needed to reach the target thickness.

18. The method of claim 15, wherein upon determining the post-polish thickness of the substrate is equal to a target thickness, transferring the substrate to a dry cassette.

19. An integrated chemical mechanical polishing (CMP) system for polishing substrates, the CMP system comprising:
a polishing station configured to polish a substrate;
a spin rinse dry (SRD) station configured to clean and dry the substrate; and
a metrology station configured to measure parameters of the substrate, wherein the metrology station further comprises:
a support frame;
a substrate holder disposed on the support frame and configured to support the substrate;
a camera disposed above the substrate holder; and
a scale for weighing coupled between the support frame and the substrate holder; and
a lighting system disposed between the scale and the support frame.

20. The integrated CMP system of claim 19 further comprising:
an end effector rinse dry (EERD) station further comprising:
rinse nozzles configured to spray a fluid at an end effector of a substrate moving robot;
an air knife configured flow gas against the end effector;
a drain to collect the sprayed fluid; and
a vent configured to exhaust the flowed gas.

* * * * *